United States Patent [19]
Kawashima

[11] Patent Number: 5,541,431
[45] Date of Patent: Jul. 30, 1996

[54] SEMICONDUCTOR DEVICE HAVING TRANSISTOR PAIR

[75] Inventor: Shoichiro Kawashima, Kawasaki, Japan

[73] Assignee: Fujitsu Limited, Kawasaki, Japan

[21] Appl. No.: 817,801

[22] Filed: Jan. 9, 1992

[30] Foreign Application Priority Data

Jan. 9, 1991 [JP] Japan ..................... 3-000987
Jan. 9, 1991 [JP] Japan ..................... 3-000988

[51] Int. Cl.$^6$ ............ H01L 27/01; H01L 27/12; H01L 31/0392
[52] U.S. Cl. ............ 257/347; 257/348; 257/350
[58] Field of Search ............ 257/347, 348, 257/350

[56] References Cited

U.S. PATENT DOCUMENTS 5,095,347  3/1992  Kirsch ..................... 257/347

FOREIGN PATENT DOCUMENTS 1-264254  10/1989  Japan ..................... H01L 27/08
2-101772   4/1990  Japan ..................... H01L 27/088

*Primary Examiner*—Stephen D. Meier

[57] ABSTRACT

A semiconductor device has a plurality of transistor pairs. Each transistor pair includes a p-channel current path having a pair of p-type current terminal regions arranged by sandwiching a high resistivity of a first channel region, an n-channel current path having a pair of n-type current terminal regions arranged by sandwiching a high resistivity of a second channel region. The first channel region and the second channel region exert each electric field on each other by their intrinsic charges and are adjacently arranged so as to serve as a gate.

26 Claims, 12 Drawing Sheets

5,541,431

SEMICONDUCTOR DEVICE HAVING TRANSISTOR PAIR

BACKGROUND OF THE INVENTION

1. Field of the Invention

The present invention relates to a new type of a semiconductor device, more particularly, to a semiconductor device having at least one transistor pair which, based upon a new operational principle, has a simplified constitution suitable for higher integration.

Hereinafter, the term "polycrystal" includes "amorphous", so far as it is not refused.

2. Description of the Related Art

In general, a bipolar transistor and a field effect transistor (FET) are mainly used as transistors in the prior art. In a highly integrated semiconductor device, an insulation gate type FET particularly is widely used.

Conventional technologies will be described with reference to FIGS. 1(A), 1(B) and 1(C).

FIG. 1(A) is a schematic view showing a structure of an insulation gate type FET in conventional technologies. In FIG. 1(A) a pair of n-type domains 62, 63 are formed on the surface of a p-type substrate 61, with a sandwiched channel region 64, to create a source/drain region. A gate electrode 67 is formed on the substrate 61 through an insulation film 66. Based on a voltage applied on the gate electrode 67, a channel region 64 is controlled to adjust a current path between source/drain regions 62 and 63.

FIG. 1(B) is a schematic view showing the operation of an FET shown in FIG. 1(A). A source region 62 is grounded and a positive potential is applied to a drain region 63. As the case may be, since a pn junction around the drain region 63 is adversely biased a depletion layer 65 is formed around the drain region 63.

When a positive potential is applied on a gate electrode 67, a hole in the channel region 64 is excluded by the positive potential to attract electrons. Thus, an n-channel is formed in the channel region 64. If the n-channel makes a source region 62 and a drain region 63 connect therewith, current flows between the source and the drain.

The n-channel FET is disck in FIG. 1(A) and FIG. 1(B) and when the conductivity type in each region is inverted, a p-channel FET is obtained. In the case of a p-channel FET, the polarity of applied voltage is inverted.

A flip-flop is constituted by means of cruciform wiring of four transistors. A memory element of an SRAM has a form such that transfer gates are connected to an interconnecting point of a flip-flop.

Fundamentally, four transistors are employed in the flip-flop and six transistors are employed in the static RAM (SRAM). From the stand point of high integration, it is required that these logic elements can be formed in a narrow area as much as possible.

FIG. 1(C) illustrates an example of an SRAM configuration for which a high integration is intended. A transistor T11 and a transistor T12 are series-connected at a connection node N1, and a transistor T13 and a transistor T14 are series-connected at a connection node N2. These connection nodes N1 and N2 are led outward via transfer gates T15 and T16, respectively. The node N1 is connected to each gate of a transistor T13 and a transistor T14, while the node N2 is connected to each gate of a transistor T11 and a transistor T12.

With respect to the structure of the device, transistors T11 and T13 are produced by a thin film transistor using polycrystalline silicon, in order to enhance integration.

That is, transistors T12, T14 and transistors T15, T16 are formed in a semiconductor substrate and load transistors T11 and T13 are formed in a polycrystalline silicon thin film formed on the semiconductor substrate. An adoption of such solid structure enables an enhancement of integration.

According to the prior art, it is necessary for one FET to be provided with three electrode regions, that is, a source, a drain and a gate. Accordingly, it is necessary to provide 3n electrode regions to produce n transistors.

SUMMARY OF THE INVENTION

An object of the present invention is to provide a semiconductor device having a simplified structure.

Another object of the present invention is to provide a semiconductor device having a simplified transistor pair structure in which one region can be utilized to fulfil a double function or more than two functions.

In accordance with a feature of the present invention, there is provided a semiconductor device having a plurality of transistor pairs, said transistor pairs comprising:

a p-channel current path having a pair of p-type current terminal regions arranged by sandwiching a high resistivity of a first channel region;

an n-channel current path having a pair of n-type current terminal regions arranged by sandwiching a high resistivity of a second channel region; wherein the first channel region and the second channel region each exert an electric field on each other by their intrinsic charges and are adjacently arranged so as to serve as a gate.

In accordance with another feature of the present invention, there is provided a semiconductor device comprising:

a first current path formed at a first potential level, for providing a pair of current terminal regions arranged by sandwiching a first channel region;

a second current path formed at the first potential level, for providing a pair of current terminal regions arranged by sandwiching a second level channel region;

a third current path formed at a second potential level close to the first level, for providing a pair of current terminal regions arranged by sandwiching a third channel region; and a fourth current path formed at the second potential level for providing a pair of current terminal regions arranged by sandwiching a fourth channel region; wherein both the first channel region and third channel region and both the second channel region and fourth channel region exert an electric field on each other by each intrinsic charge and adjacently arranged to serve as a gate.

In accordance with still another feature of the present invention, there is provided a semiconductor device comprising:

a first current path arranged at a first potential level, for providing a first channel region formed by a high resistivity of semiconductivity and a first pair of low resistivity of current terminal region arranged on both sides of the first channel region;

a second current path arranged at a second potential level adjacent to the first level, for providing a second channel region formed by a high resistivity of semiconductor and a second pair of low resistivity of current terminal region arranged on both sides of the second channel region; and a separation means for separating the first current path and the second current path electrically; wherein the first channel region and one of the second pair of current terminal regions are adjacently arranged and the second channel region and one of said first pair of current terminals are adjacently arranged, and said first current path and said second current path form a transistor pair that interacts via electric field with each other.

In a flip-flop (FF) circuit two pairs of transistors are used.

A first semiconductor layer, an insulator layer and a second semiconductor layer are laminated on an insulator substrate to form transistors Tr1 and Tr2 in the first semiconductor layer and to form a third transistor Tr3 and a fourth transistor Tr4 in the second semiconductor layer.

Suppose that a first transistor Tr1 and a second transistor Tr2 are n-channel transistors, and a third transistor Tr3 and a fourth transistor Tr4 are p-channel transistors. The first transistor Tr1 and the third transistor Tr3 are arranged opposite each other and each channel region is arranged in the same vicinity. The second transistor Tr2 and the fourth transistor Tr4 are arranged opposite each other and in the same vicinity.

Thus, the first and third transistors Tr1 and Tr3 constitute a transistor pair and the second transistor Tr2 and the fourth transistor Tr4 also constitute a transistor pair.

One side electrode terminal region of the first transistor Tr1 is interconnected with one side electrode terminal region of the fourth transistor Tr4 and one side electrode terminal region of the second transistor Tr2 is interconnected with one side electrode terminal region of the third transistor Tr3.

A ground level Voltage $V_{ss}$ is applied to electrode terminals of the first transistor Tr1 and the second transistor Tr2 that are not interconnected therewith, while a positive dc rail voltage $V_{cc}$ is applied to electrode terminals of the third transistor Tr3 and the fourth transistors Tr4 not interconnected therewith. Thus, the first transistor Tr1 and the fourth transistor Tr4 form a series-connected transistor and the second transistor Tr2 and the third transistor Tr3 also form a series-connected transistor. Among these transistors, the first and the third transistors Tr1 and Tr3 exert influence on each other and are operated, and the second and the fourth transistors Tr2 and Tr4 also exert influence on each other and are operated.

Thus, one state is such that the first transistor Tr1 and the third transistor Tr3 turn ON and the second transistor Tr2 and the fourth transistor Tr4 turn OFF and the other state is such that TR1 and Tr3 turn OFF and Tr2 and Tr4 turn ON, to form a flip-flop circuit by four transistors Tr1, Tr2, Tr3 and Tr4.

In the configuration of another form of a flip-flop circuit, and n-channel transistor Tr1 and a p-channel transistor are formed in a first polycrystalline semiconductor layer, while a p-channel transistor Tr3 and an n-channel transistor Tr4 are formed in a second polycrystalline semiconductor layer. A second form of flip-flop circuit is provided in which an n-channel transistor and a p-channel transistor are formed in one layer and transistors Tr3 and Tr4 of the upper layer and transistors Tr1 and Tr2 of the lower layer are matched therewith and arranged thereby.

In the case of this second configuration, transistors Tr1 and Tr2 of the lower layer are interconnected therewith and transistors Tr3 and Tr4 of the upper layer also are interconnected therewith. Such connection can form the same circuit as the above.

As shown above two layers of a polycrystalline semiconductor layers formed on an insulating substrate and a transistor by means of a polycrystalline semiconductor is formed thereupon to constitute a flip-flop circuit. Nevertheless, a transistor can be formed not only on a semiconductor layer, but also in a semiconductor substrate.

Further, a transistor pair is constituted by a first transistor formed in a semiconductor substrate and a second transistor formed within a semiconductor layer formed on the first semiconductor.

Transistors Tr1 and Tr2 formed in the lower layer are formed in the surface layer of the semiconductor substrate. A polycrystalline semiconductor layer is formed on the surface of the semiconductor substrate via an insulator film to produce transistors Tr3 and Tr4.

In this way, each transistor is formed in the first level and the second level, respectively, and each transistor is associated therewith mutually to make a transistor pair and then two transistor pairs are interconnected to constitute a flip-flop circuit. It is not necessary to form a gate electrode especially in these transistor structures, and a channel region of each transistor of a transistor pair functions as a gate of the other transistor of the transistor pair.

BRIEF DESCRIPTION OF DRAWINGS

FIG. 1(A) is a schematic view showing a structure of an insulation gate type FET;

FIG. 1(B) is a schematic view showing the operation of an FET shown in FIG. 1(A);

FIG. 1(C) illustrates an example of an SRAM configuration for which a high integration is intended;

FIGS. 3(A), 3(B), 3(C) and 3(D) are views explaining pairs of transistors of an embodiment in accordance with the present invention; in which FIG. 3(A) is a view showing the configuration of a new type of transistor pair;

FIG. 3(B) is a view showing the configuration of a semiconductor device according to another embodiment of the present invention;

FIGS. 3(C) and 3(D) are a side view and a plan view of the arrangement of a transistor pair;

FIGS. 5(A), 5(B), 5(C) and 5(D) are views showing the configuration of a static RAM according to another embodiment of the present invention, in which FIG. 5(A) shows an equivalent circuit of a SRAM;

FIG. 5(B) is a plan view showing one pattern embodying a circuit shown in FIG. 5(A);

FIGS. 5(C) and 5(D) are plan views showing a pattern within a substrate and a pattern of a polycrystalline semiconductor film thereon, both of which are divided from the pattern of FIG. 5(B);

FIGS. 8(A), 8(B) and 8(C) are views showing a first configuration of an SRAM of an embodiment of the invention, in which FIG. 8(A) is a view showing a first layer, FIG. 8(B) a second layer, and FIG. 8(C) a laminated layer of SRAM, respectively;

DETAILED DESCRIPTION OF THE PREFERRED EMBODIMENTS

An embodiment of the present invention will be described with reference to the drawings.

Figure 1A:
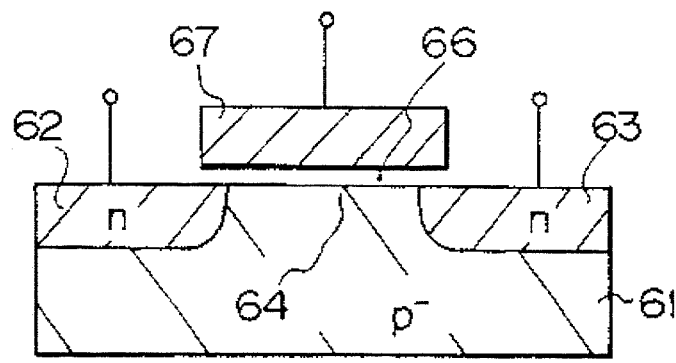
FIGS. 1(A) to 1(C) are related to conventional technologies.
Figure 1B:
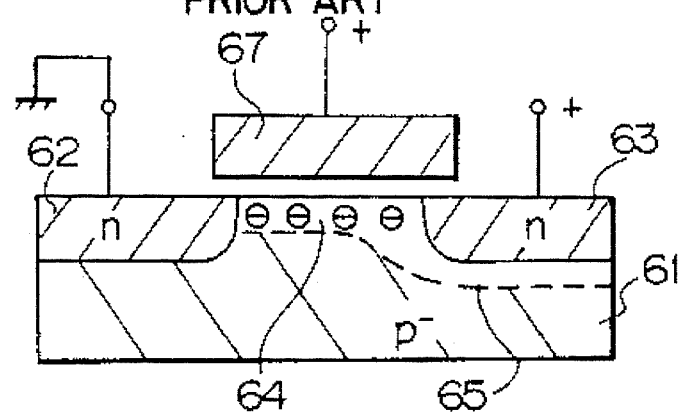
Figure 1C:
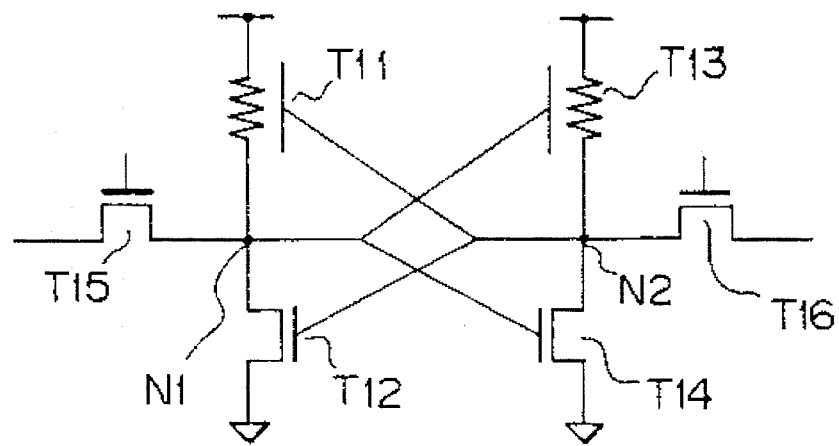
Figure 2A:
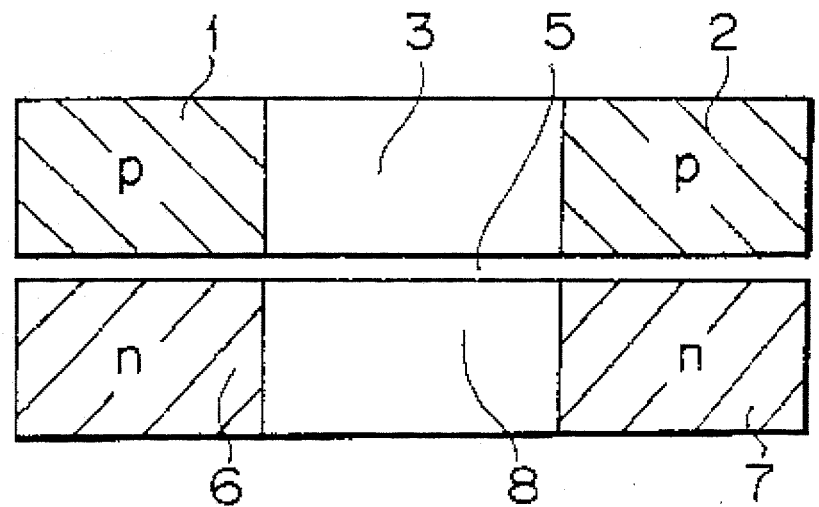
FIG. 2(A) is a schematic view explaining the outline of a structure of a semiconductor device in accordance with the present invention.
Figure 2B:
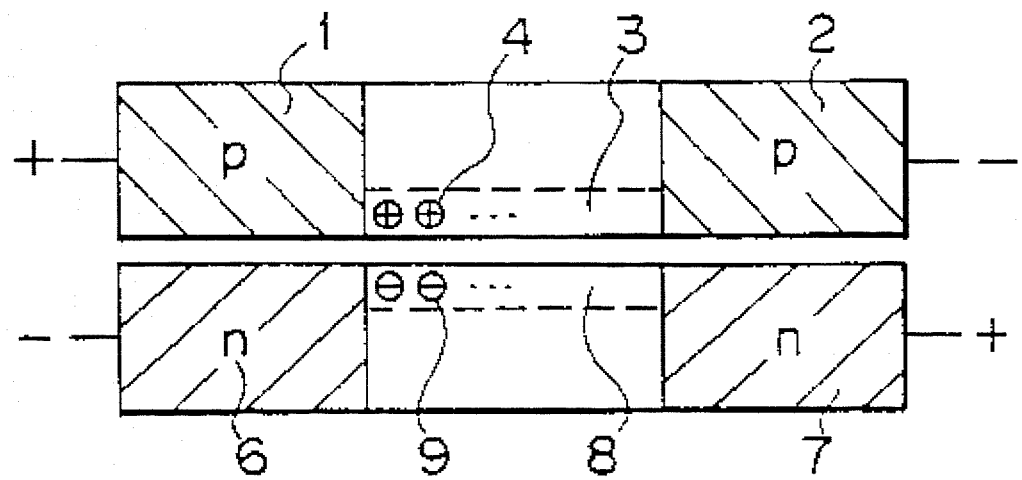
FIG. 2(B) is a schematic view showing an outline of the operation of a semiconductor device based on the structure shown in FIG. 2(A)

FIGS. 2(A) and 2(B) are views for explaining a principle of the present invention. FIG. 2(A) is a schematic view explaining the outline of a structure of a semiconductor device in accordance with the present invention. P-type regions 1 and 2 are sandwiched with a high resistivity of channel region 3 therebetween and are arranged opposite each other. Also, n-type regions 6 and 7 are sandwiched with a high resistivity of channel region 8 and are arranged opposite each other. Both channel regions 3 and 8 are arranged adjacently opposite each other to easily apply an electric field to each other.

FIG. 2 (B) is a schematic view showing an outline of the operation of a semiconductor device based on the structure shown in FIG. 2(A). A positive potential is applied to a p-type region 1 and a negative potential is applied to a p-type region 2. On the other hand, a negative potential is applied to an n-type region 6 and a positive potential to another n-type region 7. Under the condition of such applied voltage, for example, the influence of a positive potential applied to the p-type region 1 extends to an adjacent channel region 3 and a closely disposed channel region 8. A negative charge 9 is induced in the closely disposed channel region 8 by these influences. A positive charge 4 is induced in the channel region 3 in the vicinity of the n-type region 6 applied by a negative voltage. These charges 4 and 9 induce charges of opposite polarity in the channel region closely disposed.

As is the case with the above, a positive charge is induced in the channel region 3 to form a p-channel and a negative charge 9 is induced in the channel region 8 to form an n-channel.

Therefore, the channel regions 3 and 8 function as a channel region, respectively, and moreover, set up the operation of a gate electrode with respect to the other channels 8 and 3.

As for such transistor-pair structure, since each channel region functions as a gate of the other side, each transistor can operate without providing a gate electrode.

As a result, a flip-flop circuit, a static random access memory (abbreviated by SRAM) or the like can be designed by utilizing this pair of transistors.

An embodiment of the present invention will be described with reference to FIGS. 3(A) to (D) and FIG. 4.

Figure 3A:
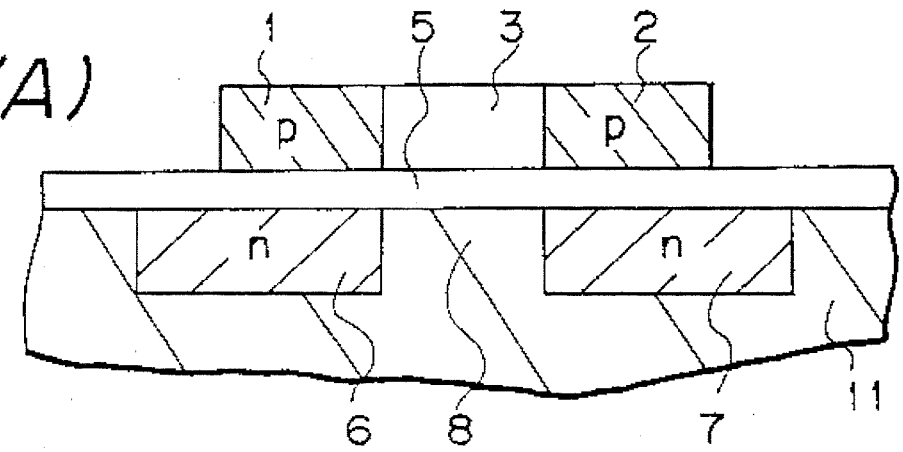

FIGS. 3(A) to 3(D) are views explaining pairs of transistors of an embodiment in accordance with the present invention. In FIG. 3(A), a pair of n-type regions 6 and 7 are formed in a surface region of a p-type semiconductor substrate 11. A high resistivity of region 8 sandwiched between a pair of n-type regions 6 and 7 forms a channel region. A polycrystalline semiconductor layer is formed on the surface of the semiconductor substrate 11 via an insulator film 5. The polycrystalline semiconductor may be substituted by an amorphous semiconductor. A pair of p-type regions 1 and 2 are formed in the polycrystalline semiconductor layer. A high resistivity of channel region 3 is sandwiched and arranged between this pair of p-type regions 1 and 2. The channel region 3 is opposite the channel region 8 in the semiconductor substrate 11 and arranged therein. The thickness of an insulator film is so thinly selected that, when a negative charge is induced on the surface of a channel region 8 of the semiconductor substrate 11, a positive charge is induced in the opposite channel region 3 by the negative charge.

The semiconductor substrate 11 is formed, for example, by a single crystal silicon semiconductor substrate, an insulator film 5 is formed, for example, by oxide silicon, and a semiconductor layer thereon is formed by, e.g., polycrystalline silicon. The semiconductor substrate 11 also may be formed on the side (perpendicular to a wafer) of a trench structure of a groove structure.

Figure 3B:
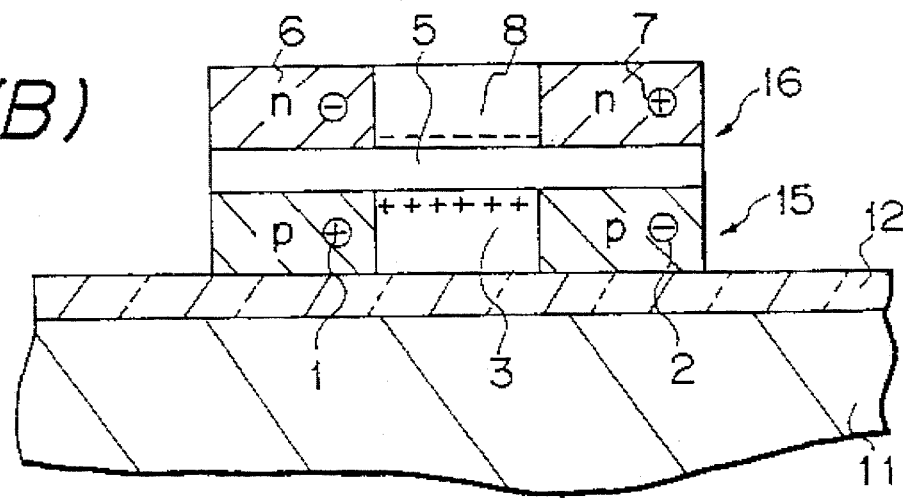

FIG. 3(B) illustrates a semiconductor device according to another embodiment of the present invention. Two layers of polycrystalline silicon layer 15 and 16 are formed via an oxide film 12 on the semiconductor substrate 11. A pair of p-type regions 1 and 2 are formed by sandwiching a high resistivity of channel region 3 within a lower layer of polycrystalline silicon layer 15. A pair of n-type regions 6 and 7 are formed by sandwiching a high resistivity of channel region 8 within an upper layer of polycrystalline silicon layer 16. An insulator film 5 such as an oxide film is disposed between the lower layer of polycrystalline silicon layer 15 and the upper layer of polycrystalline silicon layer 16. The channel region 8 is arranged by matching with the lower layer of channel region 3.

For example, if a positive potential is applied to a p-type region 1, a negative charge is induced in the neighboring-disposed channel region 8. Similarly, if a negative potential is applied to an n-type region 6, a positive charge is induced on the surface of the channel region 3. These charges induce an opposed-polarity of charge to each other to form an n-channel in the channel region 8 and a p-channel in the channel region 3. Also, the polycrystalline silicon layers 15 and 16 and an oxide film therebetween may be formed in the direction perpendicular to a wafer.

In a semiconductor substrate or a semiconductor layer arranged in a superposed manner, a pair of current paths are formed and channel regions are arranged opposite and they exert opposing fields on each other, thereby a pair of transistors exert influence on one another.

In the structure of such pair of transistors a respective channel region is operated as the structure of a gate of another transistor.

In the above, the example that two transistors of a p-channel transistor and a n-channel transistor are superposed is described and more than three transistors may be laminated. For example, a three-level structure such as a combination of n-channel-p-channel-n-channel or p-channel-n-channel-p-channel or a multi-level transistor structure that inverts a conductive type alternately can be easily designed.

Figure 3C:
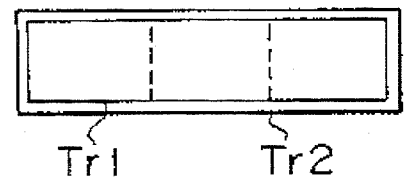
Figure 3D:
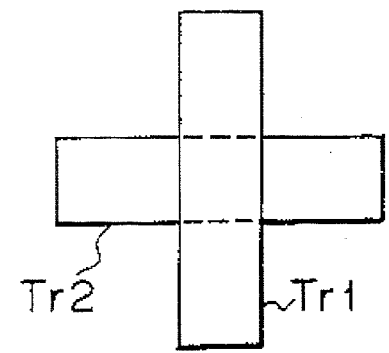

FIG. 3(C) and FIG. 3(D) illustrate a side view and a plan view of the arrangement of a pair of transistors.

FIG. 3(C) is a side view showing a constitution that a transistor Tr1 and a transistor Tr2 are superposed as a whole. A respective source/drain region is superposed with a respective channel region.

FIG. 3(D) is a plan view showing a constitution that a transistor Tr1 of the upper layer intersects with a transistor Tr2 of the lower layer to be arranged thereon. As is the case with such a constitution, the channel regions are superposed to exert influence on each other, thereby two transistors operate in connection therewith each other.

When one transistor of such transistor pair turns ON, the other transistor also turns ON. When one transistor of the transistor pair turns OFF, the other transistor also turns OFF.

Some examples of circuitry that is constituted by using such transistor pair is described hereinafter.

Figure 4A:
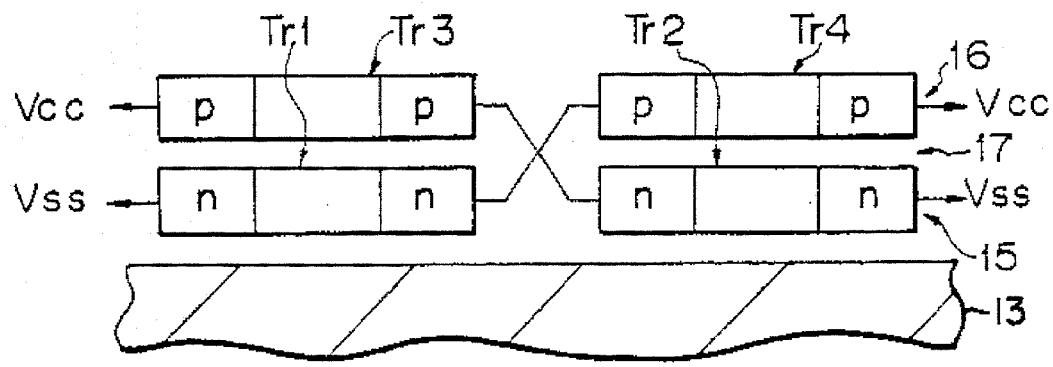
FIGS. 4(A), 4(B), and 4(C) are diagrams showing how two pairs of transistor pairs are used to constitute a flip-flop circuit.
Figure 4B:
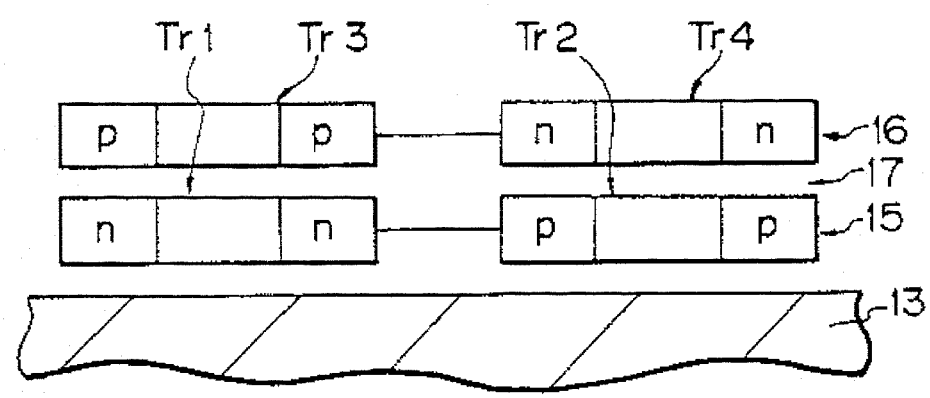
Figure 4C:
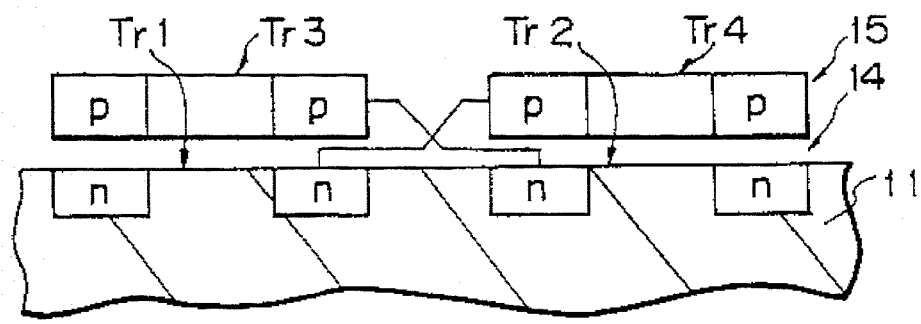

FIGS. 4(A) to 4(C) show examples such that two pairs of the above-described transistor pairs are used to constitute a flip-flop (FF) circuit.

In FIG. 4(A), a first semiconductor layer 15, an insulator layer 17 and a second semiconductor layer 16 are laminated on an insulator substrate 13 to form transistors Tr1 and Tr2 in the first semiconductor layer 15 and to form a third transistor Tr3 and a fourth transistor Tr4 in the second semiconductor layer 16.

In FIG. 4(A), a first transistor Tr1 and a second transistor Tr2 are n-channel transistors, and a third transistor Tr3 and a fourth transistor Tr4 are p-channel transistors.

The first transistor Tr1 and the third transistor Tr3 are arranged opposite each other and each channel region is arranged in the same vicinity. The second transistor Tr2 and the fourth transistor Tr4 are arranged opposite each other and in the same vicinity.

Thus, the first and third transistors Tr1 and Tr3 constitute the above described transistor pair and the second transistor Tr2 and the fourth transistor Tr4 also constitute a transistor pair.

One side electrode terminal region of the first transistor Tr1 is interconnected with one side electrode terminal region of the fourth transistor Tr4 and one side electrode terminal region of the second transistor Tr2 is interconnected with one side electrode terminal region of the third transistor Tr3.

A voltage $V_{ss}$ (ground level voltage) is applied to electrode terminals of the first transistor Tr1 and the second transistor Tr2 that are not interconnected therewith, while a voltage $V_{cc}$ (the positive dc rail voltage) is applied to electrode terminals of the third transistor Tr3 and the fourth transistor Tr4 not interconnected therewith. Thus, the first transistor Tr1 and the fourth transistor Tr4 form a series-connected transistor and the second transistor Tr2 and the third transistor Tr3 also form a series-connected transistor. Among these transistors, the first and the third transistors Tr1 and Tr3 exert influence on each other and are operated, and the second and the fourth transistors Tr2 and Tr4 also exert influence on each other and are operated.

Thus there exist two states, viz., one state is such that the first transistor Tr1 and the third transistor Tr3 turn ON and the second transistor Tr2 and the fourth transistor Tr4 turn OFF and the other state is such that Tr1 and Tr3 turn OFF and Tr2 and Tr4 turn ON, to form a flip-flop circuit by four transistors Tr1, Tr2, Tr3 and Tr4.

FIG. 4(B) illustrates a configuration of another form of a flip-flop circuit. In this configuration, an n-channel transistor Tr1 and a p-channel transistor are formed in a first polycrystalline semiconductor layer 15, while a p-channel transistor Tr3 and an n-channel transistor Tr4 are formed in a second polycrystalline semiconductor layer 16. As above, a specified form of flip-flop circuit is provided in which an n-channel transistor and a p-channel transistor are formed in one layer and transistors Tr3 and Tr4 of the upper layer and transistors Tr1 and Tr2 of the lower layer are matched therewith and arranged thereby.

In the case of this configuration, transistors Tr1 and Tr2 of the lower layer are interconnected therewith and transistors Tr3 and Tr4 of the upper layer also are interconnected therewith. Such connection can form the same circuit as in FIG. 4(A).

As shown above in FIG. 4(A) and FIG. 4(B), two layers of a polycrystalline semiconductor layers formed on an insulating substrate 13 and a transistor by means of a polycrystalline semiconductor is formed thereupon to constitute a flip-flop circuit. Nevertheless, a transistor can be formed not only on a semiconductor layer, but also in a semiconductor substrate.

FIG. 4(C) is a view showing a transistor pair as described above constituted by a first transistor formed in a semiconductor substrate and a second transistor formed within a semiconductor layer formed on the first semiconductor and FIG. 4(C) illustrates a configuration which forms a flip-flop circuit on the whole.

In FIG. 4(C), transistors Tr1 and Tr2 formed in the lower layer 15 as shown in FIG. 4(A), are formed in the surface layer of semiconductor substrate 11. A polycrystalline semiconductor layer 15 is formed on the surface of the semiconductor substrate 11 via an insulator film 14 to produce transistors Tr3 and Tr4.

In this way, each transistor is formed in the first level and the second level, respectively, and each transistor is associated therewith mutually to make a transistor pair and then two transistor pairs are interconnected to constitute a flip-flop circuit. It is not necessary to form a gate electrode especially in these transistor structures, and a channel region of each transistor of a transistor pair functions as a gate of the other transistor of the transistor pair.

FIGS. 5(A) to 5(D) are views showing the configuration of a static RAM (abbreviated by SRAm) according to other embodiments of the present invention.

Figure 5A:
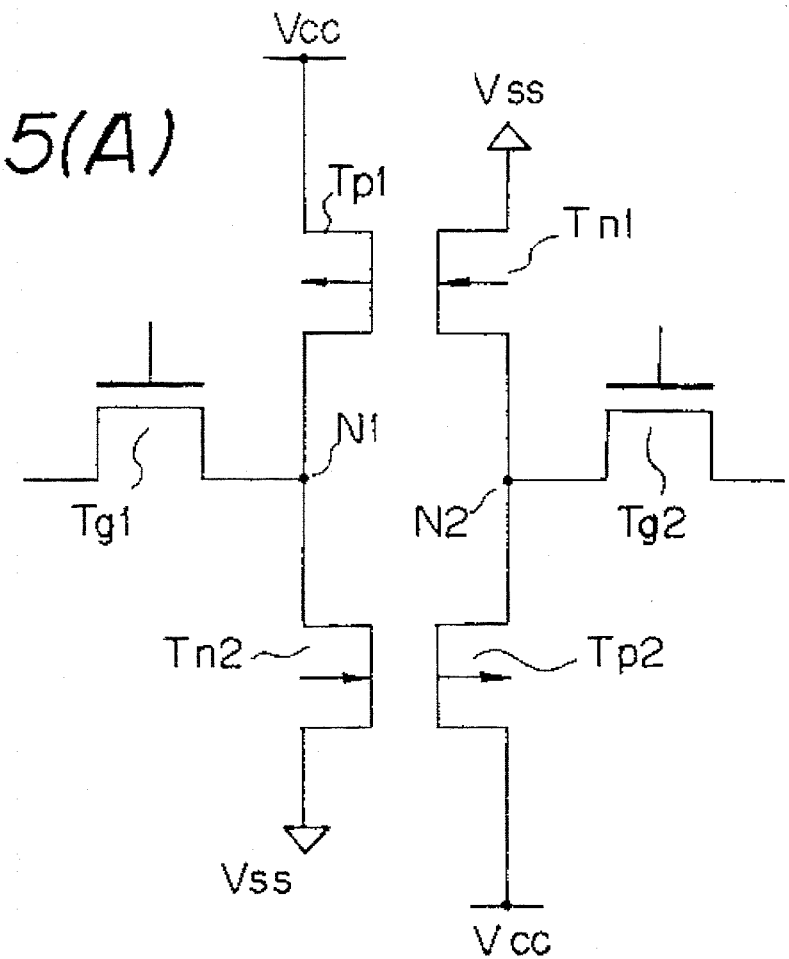

FIG. 5(A) shows an equivalent circuit of a SRAM. Transistors $T_{p1}$ and $T_{n2}$ are connected in series and these transistors are connected between a voltage $V_{cc}$ and a voltage $V_{ss}$. Also, transistors $T_{n1}$ and $T_{p2}$ are connected in series and the transistors are connected between a voltage $V_{ss}$ and a voltage $V_{cc}$.

Transistors $T_{g1}$ and $T_{g2}$ that are operated as transfer gates are connected with connection nodes $N_1$ and $N_2$ of these transistors.

Four transistors $T_{p1}$, $T_{n2}$, $T_{n1}$, $T_{p2}$ function as a flip-flop circuit and two transfer gates $T_{g1}$ and $T_{g2}$ play a role in outputting/inputting a signal to nodes $N_1$ and $N_2$.

Figure 5B:
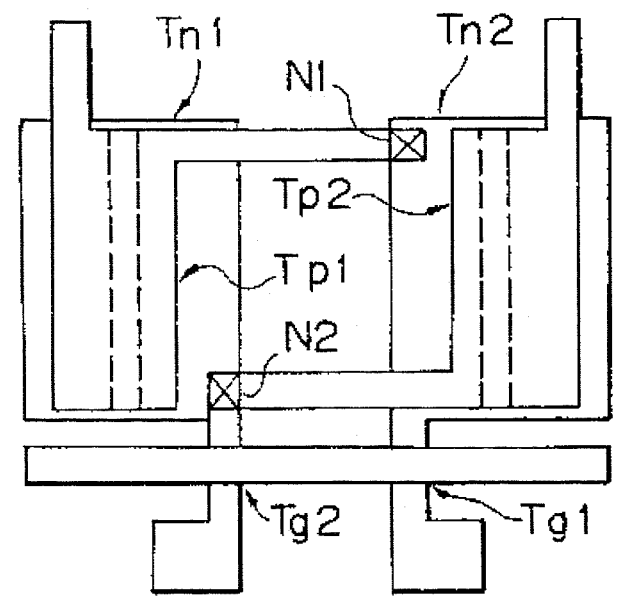

FIG. 5(B) is a plan view showing one pattern embodying a circuit shown in FIG. 5(A). Transistors $T_{n1}$, $T_{n2}$ and transfer gates $T_{g1}$, $T_{g2}$ are formed in a semiconductor substrate and in a polycrystalline silicon layer formed via an insulator film such as an oxide film thereupon, two p-channel transistors $T_{p1}$ and $T_{p2}$ are formed. The p-channel transistor $T_{p1}$ and an n-channel transistor $T_{n2}$ of the substrate are interconnected therewith at a location of a node $N_1$ and the p-channel transistor $T_{p2}$ and the n-channel transistor $T_{n1}$ are interconnected therewith at the location of a node $N_2$.

Figure 5C:
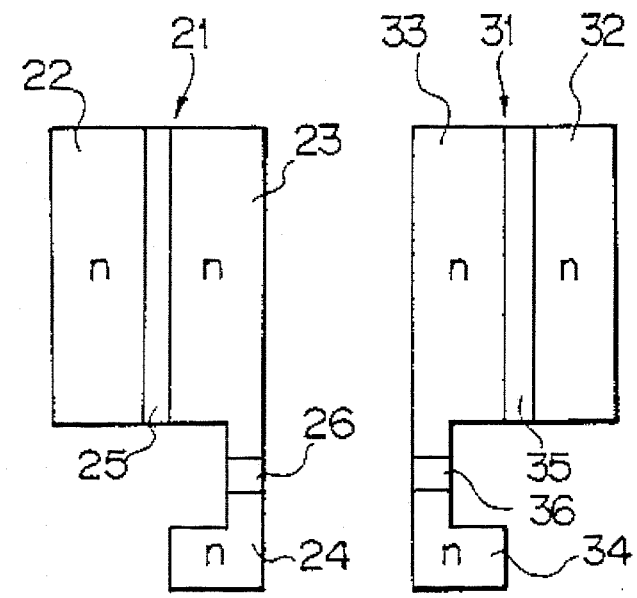
Figure 5D:
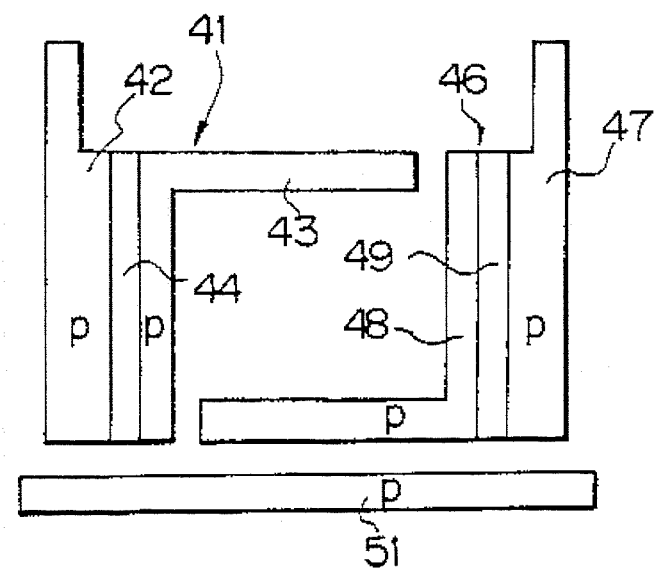

FIGS. 5(C) and 5(D) are plan views showing a pattern within a substrate and a pattern of a polycrystalline semiconductor film thereon, both patterns of which are divided thereinto from a pattern of FIG. 5(B).

As shown in FIG. 5(C), two blocks 21 and 31 are formed in a semiconductor substrate and three n-type semiconductor regions 22, 23 and 24 that sandwich high resistivity regions 25 and 26, are formed in the block 21. Two transistors are formed by this configuration. As same, three n-type regions 32, 33 and 34 that sandwich high resistivity region 35 and 36, are formed in the block 31 to constitute two transistors. The other channel regions made of a polycrystalline semiconductor layer are arranged on each high resistivity region, the channel region plays a role as a gate.

If a thin film pattern in FIG. 5(D) is disposed on the substrate pattern in FIG. 5(C) to match each high resistivity region therewith, the configuration of FIG. 5(B) is realized. Thus, the circuit shown in FIG. 5(A) is constituted.

If two transfer gates $T_{g1}$ and $T_{g2}$ are removed from the configuration of the SRAM, a configuration of a flip-flop circuit can be attained.

Hereinunder, a series of the manufacturing steps that form a SRAM or a flip-flop circuit will be described.

First of all, a silicon oxide film of a thickness of about 500 nm is grown selectively on a silicon substrate in a wet atmosphere at a temperature of 900° C. by means of a thermal oxidation method to produce a field oxidation film around the element region.

Next, a width of about 20 nm of silicon oxidation film is grown on the element region by means of a thermal oxidation method.

A photo resist layer is formed on the silicon oxidation film to effect lithography selectively and a region for forming an n-type region is opened. A silicon oxidation film remains under an opening of the resist.

Arsenium ions As$^+$ are ion-implanted with an accelerating energy of about 70 KeV by a dose of about $1\times10^{15}$ cm$^{-2}$ into an opening for dosing. An n-type region is formed under the opening portion by the ion-implantation method.

Thereafter, a photoresist used as a mask is removed.

Next, a new photoresist layer is formed and an opening is formed in the region in which an electrode contact is formed. Using this photoresist mask, an oxide film is etched to expose the surface of a semiconductor member.

Thereafter, the photoresist used as a mask is removed.

A polycrystalline silicon is deposited on the surface of a semiconductor substrate by a chemical vapor deposition method at a width of about 40 nm.

A photoresist layer is formed on the polycrystalline silicon layer and an opening is formed on the region in which a p-type region is formed.

The photoresist layer serves as a mask and BF$_2^+$ ion is ion-implanted with an acceleration energy of about 5 KeV by a dose of $1\times10^{14}$ cm$^{-2}$. A p-type region is formed in the polycrystalline silicon layer by the ion-implantation.

The photoresist layer used as the mask is removed.

A new photoresist layer is formed on the polycrystalline silicon layer to form a mask for etching. Utilizing the mask, the lower portion of the polycrystalline silicon layer is etched to form a pattern.

Thereafter, the photoresist used as the mask is removed. Then annealing is effected for activating ion-implanted impurities.

An oxide film of a thickness of about 100 nm is deposited by chemical vapor deposition and the oxide film plays a role for preventing phosphor from diffusing from phospho-silicate glass (PSG) film formed on the oxide film.

Thereafter, a passivation film such as PSG is grown to a thickness of about 350 nm. A contact window is opened by penetrating a passivation film or an oxide film. Further, aluminum is sputtered on the contact window.

A photoresist layer is formed on the Al layer to form an etching mask by patterning. By using the etching mask, an aluminum layer is etched selectively to form an electrode and a wiring layer.

From the above-described steps, a semiconductor device can be formed as shown in FIG. 5.

In combination with the same photoresist step, step, etching step, and deposit step, it is well known that other configurations of semiconductor devices can be manufactured.

The present invention was described in line with the above embodiments, but the feature of the present invention is not limited to these examples. In the above, a description is such that one or two polycrystalline semiconductor layers are formed mainly on a semiconductor substrate, and more than three polycrystalline semiconductor layers including an amorphous semiconductor layer, are formed and the same semiconductor device can be formed. In the above, an insulator film of oxide silicon is described, but an insulator film of nitride or the like can be utilized.

Further, the transistor pair according to the present invention can be formed by two layers of polycrystalline semiconductor thin film formed on a silicon-on-insulator (SOI) substrate.

Still further, suppose that a holding substrate side is denoted by reference numeral 11 and an element substrate side by reference numeral 3 as shown in FIG. 3(A), and if a silicon-on-insulator substrate is used, one side of the channel current path may serve as a gate of the other side of the channel current path, whereas a respective source/drain region is superposed with a respective channel region and one side of the source and drain may serve as a gate of the other side.

Next, another feature of the present invention will be described hereinafter.

Figure 6A:
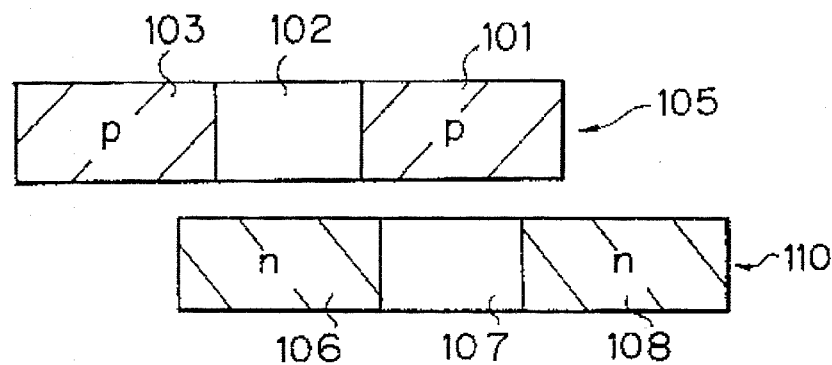
FIG. 6(A) is a schematic view showing the configuration of a transistor pair of another embodiment of the present invention.

FIG. 6(A) is a schematic view showing a transistor pair of another embodiment in accordance with the present invention.

At a first potential level, a first channel region 102 formed by a high resistivity of semiconductor and a low resistivity of p-type current terminal regions 101 and 103 arranged on both sides of the first channel region 102 are arranged. And a second channel region 107 formed by a high resistivity of semiconductor and a low resistivity of n-type current terminal regions 106 and 108 arranged on both sides of the second channel region 107, are formed at a second potential level close to the first potential level.

The first channel region 102 is arranged adjacently in the n-type current terminal region 106 by the voltage of the electric field that is controlled. The second channel region 107 is adjacently arranged in the p-type current terminal region 101 by the voltage of the electric field that is controlled.

One configuration of a transistor is formed by the first channel region 102, the p-type current terminal regions 101 and 103 on both sides of the first channel region 102, and one side of the current terminal regions 106 of the second current path.

Another configuration of a transistor is formed by the second channel region 107, the n-type current terminal regions 106, 108 on both sides thereof, and one side of the current terminal region 101 of the first current path.

Thus, two current paths that include a high resistivity of channel region and a pair of current terminal regions on both sides thereof are formed, and thereby, two configurations of a transistor can be formed. The two potential levels of current path are shown by 105 and 110.

Figure 6B:
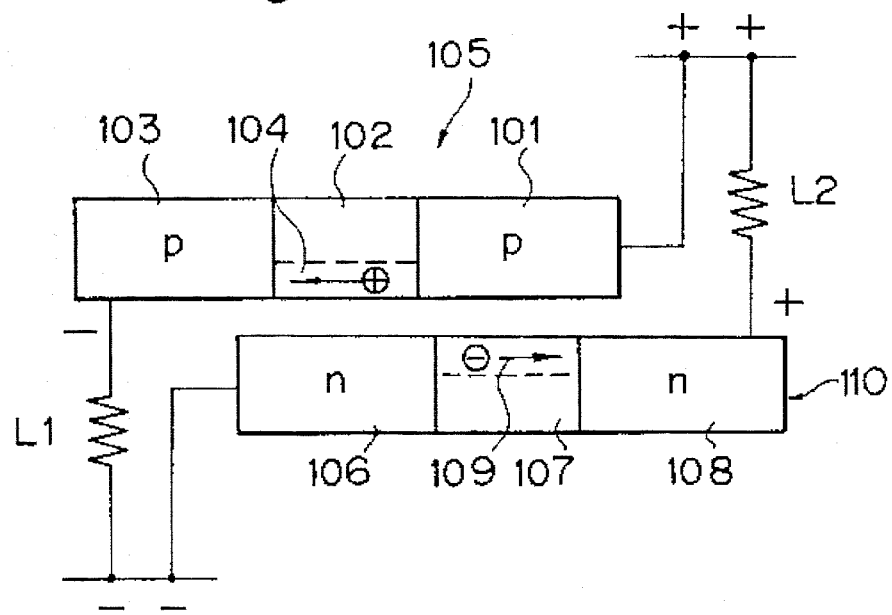
FIG. 6(B) is a view explaining the operation of a transistor pair shown in FIG. 6(A)

FIG. 6(B) is a view explaining the operation of a transistor pair shown in FIG. 6(A).

A p-type current terminal region 101 is connected to a positive potential and another p-type current terminal region 103 is connected to a negative potential via a load L1. An n-type current terminal region 106 is connected to a negative potential and another n-type current terminal region 108 is connected to a positive potential via a load L2. In such configuration the n-type current terminal region 106 possesses a negative voltage to the channel region 102. For this reason, based on the action of an electric field extended from the n-type current terminal region 106 to the channel region 102, a p-channel 104 is induced on the surface of the channel region 102.

In the same way, the p-type current terminal region 101 possesses a positive potential to the channel region 107. For this reason, based on the action of the electric field from the p-type current terminal region 101, an n-channel 109 is induced on the surface of the channel region 107.

Such being the case, current flows through both current path 105 and 110 in the configuration as shown in the figure. In this case, a load is illustrated by a resistor, but other forms of load such as a transistor may be utilized.

Such transistor pair can be realized by many sorts of configurations.

Figure 6C:
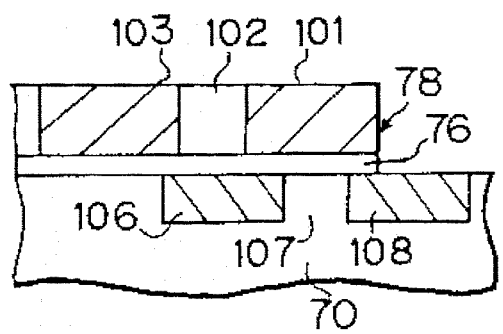
FIGS. 6(C) and 6(D) denote each application of the configuration of a transistor pair.

FIG. 6(C) denotes an application of the configuration of a transistor pair.

A pair of current terminal regions 106 and 108, both of which sandwiche a channel region 107, is formed on the surface area of a semiconductor substrate 70. An insulation film 76 is formed on the surface of the semiconductor substrate 70 and a polycrystalline semiconductor film 78 is formed thereupon. A channel region 102 and current terminal regions 101 and 103 on both sides thereof are formed in the polycrystalline semiconductor film 78. As shown in FIG. 6(A), the configuration of each region is such that one side of the current terminal regions of another current path is arranged in adjacent relation with the channel region.

Figure 6D:
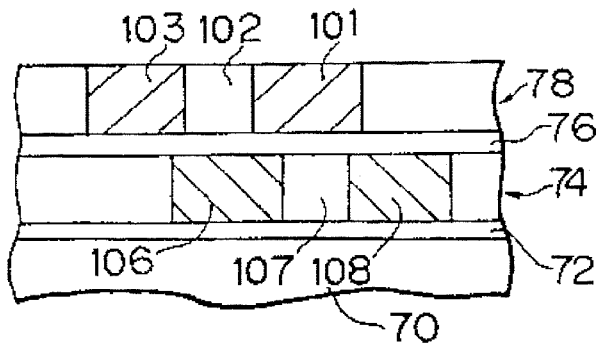

FIG. 6(D) denotes another application of the configuration of a transistor pair. A first polycrystalline semiconductor film 74 is formed on a semiconductor substrate or an insulator substrate 70 via an insulation film 72. Further, a second polycrystalline semiconductor film 78 is formed via an insulation film 76. Each current path is formed in these two polycrystalline semiconductor films 74 and 78. That is, a channel region 107 and current terminal regions 106 and 108 on both sides thereof are formed in the first polycrystalline semiconductor film 74 and a channel region 102 and current terminal regions 101 and 103 on both side thereof are formed in the second polycrystalline semiconductor film 78. The matching relationship of each region is the same as in FIGS. 6(A) and 6(C).

The above-described transistor pair operates in association therewith each other.

Figure 7A:
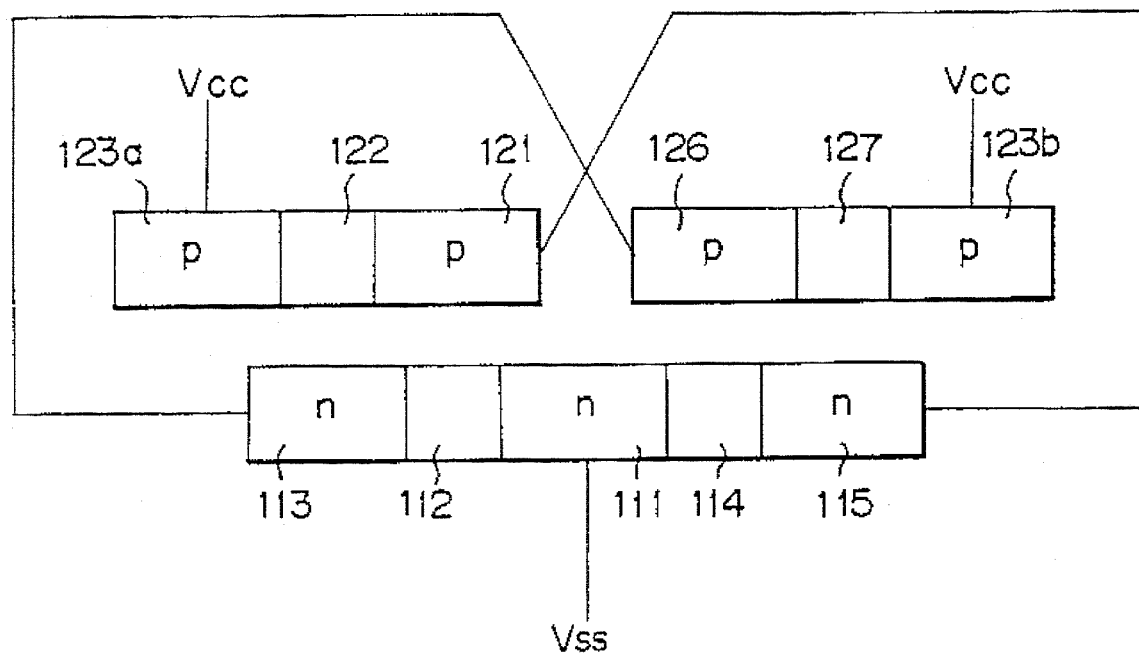
FIG. 7(A) illustrates the configuration of a flip-flop circuit and FIG. 7(D) an equivalent circuit thereof.
Figure 7B:
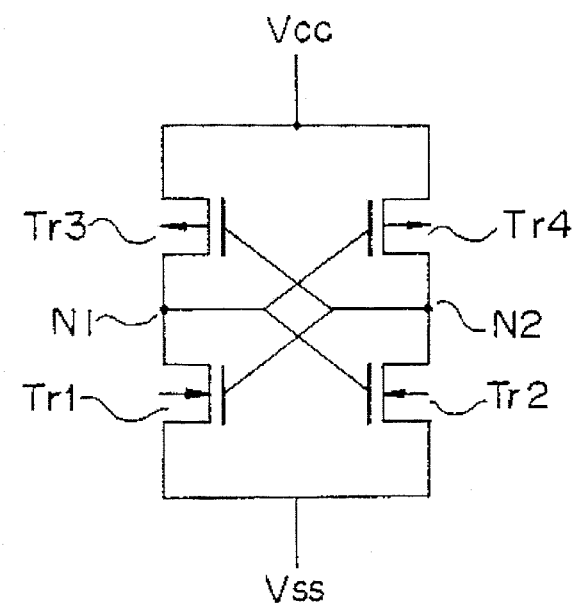

An example of a circuit formed by utilization of such transistor pair is illustrated in FIGS. 7(A) and 7(B), which shows a flip-flop circuit of an embodiment in accordance with the present invention.

FIG. 7(A) illustrates the configuration of a flip-flop circuit and FIG. 7(B) an equivalent circuit thereof.

N-type regions 111, 113 and 115 are formed in a semiconductor region arranged at a first potential level so as to sandwich high resistivity of channel regions 112 and 114. In the configuration as shown in the figure, two current paths that face from a central n-type region 111 toward both sides are formed. Another semiconductor layer is arranged at a second potential level close to the first potential level and one current path, which includes a channel region 122 and p-type regions 121 and 123a on both sides thereof and another current path which includes a channel region 127 and p-type regions 126 and 123b on both sides thereof, are formed. The p-type region 121 is arranged adjacent to the channel region 112 and an adjacent channel region 122 is arranged so as to be arranged adjacently to the n-type region 113. The channel region 127 is arranged adjacently to an n-type region 115 and a channel region 114 is arranged so as to be arranged adjacently to a p-type region 126. Further, n-type regions 113 and 115 on both sides of the first level are connected to the current terminal regions 126 and 121 of the second level, respectively. When such connection is formed, it follows that the configuration shown in FIG. 7(A) is like a circuit shown in the equivalent circuit of FIG. 7(B). That is, two n-channel current paths at the first potential level form n-channel transistors TR1 and TR2, and two p-channel current paths at the second potential level form p-channel transistors Tr3 and Tr4. These four transistors are wired to each other with cruciform like wiring with sleeves tucked up to constitute a flip-flop circuit. Common current terminals of n-channel transistors Tr1 and Tr2 are connected with a voltage $V_{ss}$ and common current terminals of p-channel transistors Tr3 and Tr4 are connected with a voltage $V_{cc}$.

An n-channel transistor Tr1 and a p-channel transistor are superposed and operated in mutual association. Also, an n-channel transistor Tr2 and a p-channel transistor Tr3 are superposed on each other and are operated in an associative relation, where N1 and N2 denote a connection node.

If a transfer gate is connected with a connection node of a flip-flop circuit, an SRAM cell can be formed.

Figure 8A:
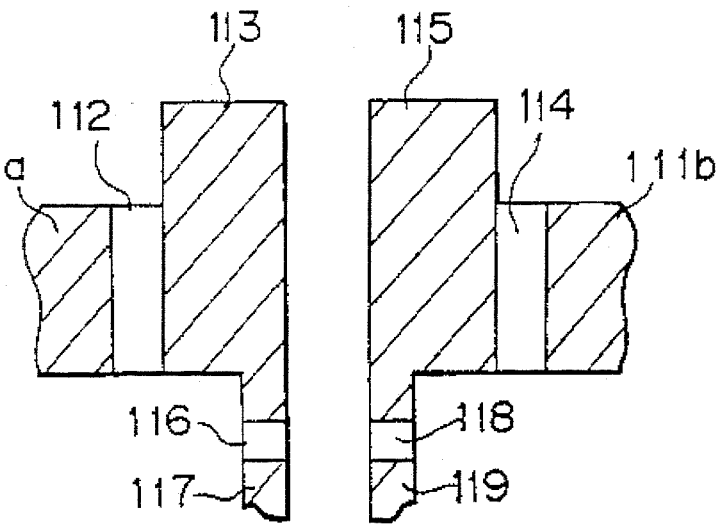
Figure 8B:
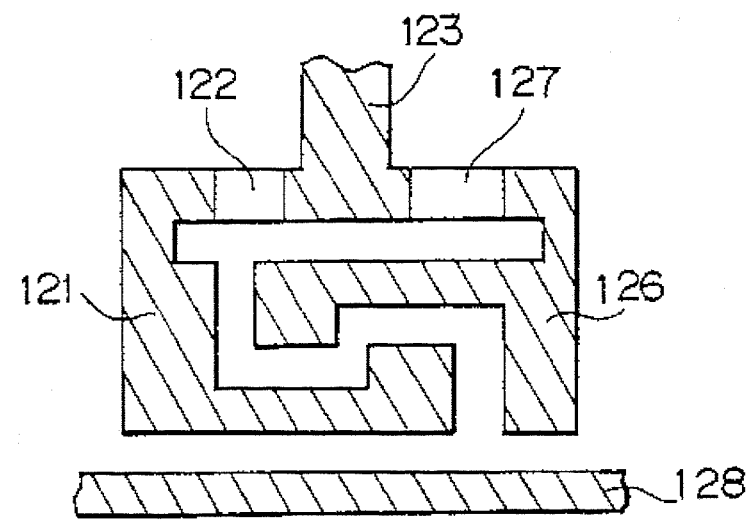
Figure 8C:
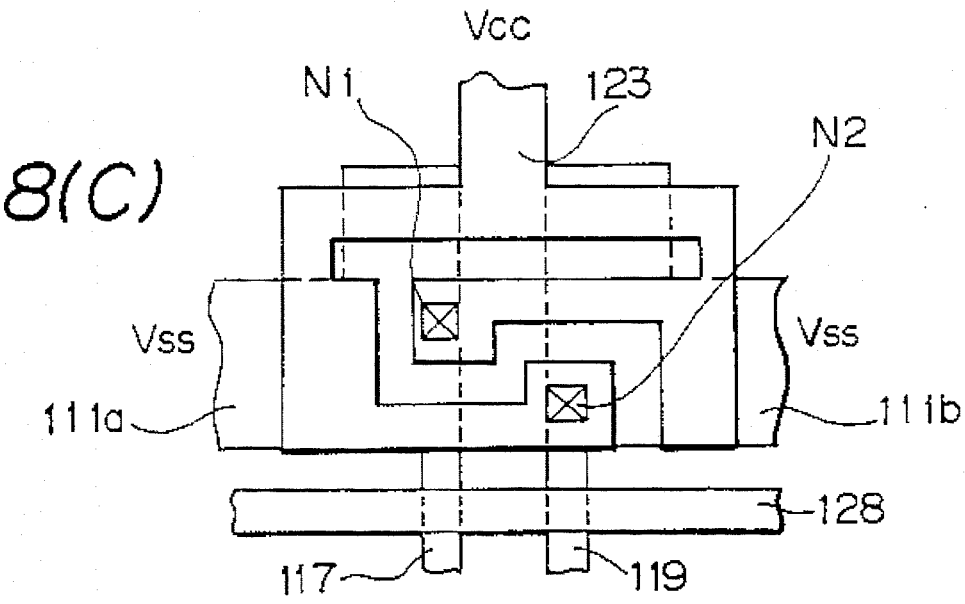

FIGS. 8(A) to 8(C) denote a first configuration of SRAM of an embodiment in accordance with the present invention.

On a first layer formed by the surface of a semiconductor substrate or a semiconductor layer on the substrate an n-type region and a high resistivity region as shown in FIG. 8(A). In the figure, hatched portions 111a, 113, and 117 are n-type regions and high resistivity of channel regions 112 and 116 are disposed therebetween. Also, high resistivity of channel regions 114 and 118 are arranged between n-type regions 111b, 115, and 119. In FIG. 8(A), each two current paths are formed on the right and left side of the configurations, respectively.

A second layer of semiconductor is formed via an insulation layer on the first layer. The pattern of the second layer is illustrated in FIG. 8(B).

A p-type region 123 is connected to p-type regions 121 and 126 via high resistivity of channel regions 122 and 127. On the lower portion, a p-type region 128 is formed.

In the configuration of FIG. 8(B), two current paths are formed. The first layer shown in FIG. 8(A) and the second layer shown in FIG. 8(B) are arranged in a laminated form by sandwiching an insulation layer as shown in FIG. 8(C). P-type regions 121 and 126 of the second layer are arranged on the channel regions 112 and 114 of the first layer to serve as a gate. Also, n-type regions 113 and 115 are arranged beneath the channel regions 122 and 127 of the second layer to serve as a gate.

Similarly, a p-type region 128 of the second layer is arranged on the channel regions 116 and 118 of the first layer to serve as a gate. As such, the configuration of an SRAM cell, including six transistors by means of the two layer configuration sandwiching an insulation layer, can be formed. The first layer and the second layer are interconnected therewith at each position of node N1 and node N2 as shown in FIG. 8(C).

The circuit realized by the configuration of FIG. 8(C) is a circuitry such that a transfer gate is connected to nodes N1 and N2 of the equivalent circuit shown in FIG. 7(B).

Figure 9A:
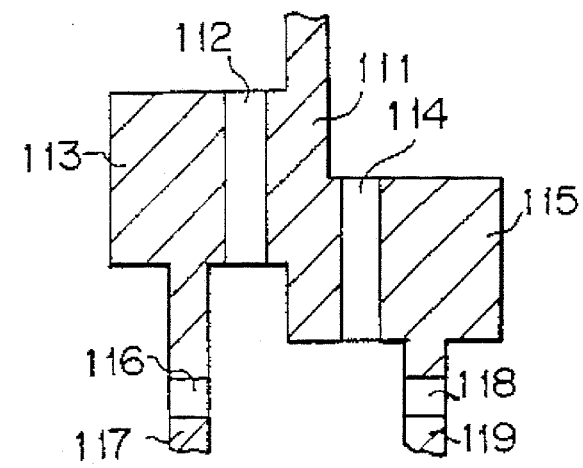
FIGS. 9(A), 9(B) and 9(C) are views showing a second configuration of an SRAM of another embodiment of the present invention.
Figure 9B:
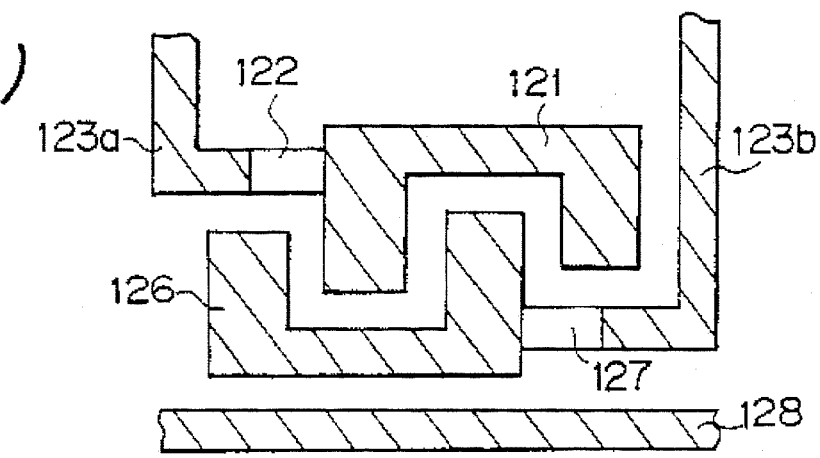
Figure 9C:
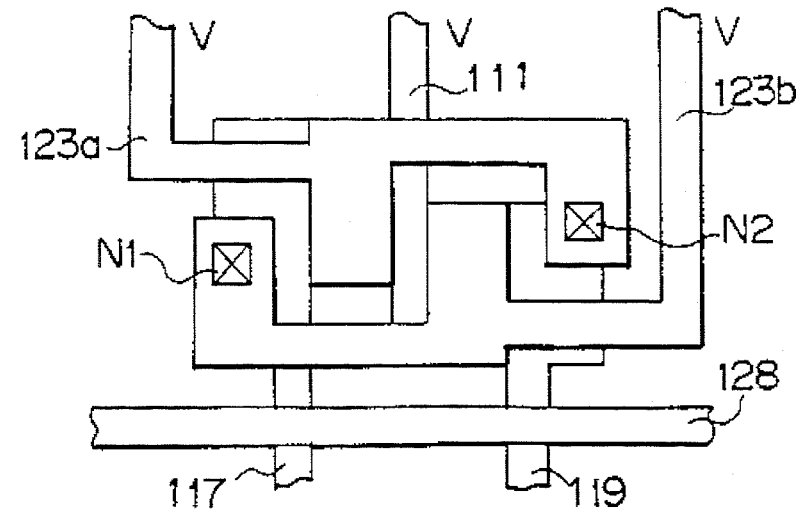

FIGS. 9(A) to 9(C) are views showing examples of the second configuration of SRAM according to another embodiment of the present invention.

FIG. 9(A) shows a pattern of the first layer. An n-type region 111 is arranged adjacent to n-type regions 113 and 115 via high resistivity of channel regions 112 and 114. Also these n-type regions 113 and 115 are arranged adjacent to n-type regions 117 and 119 via high resistivity of channel regions 116 and 118.

Four current paths are formed by such configuration of the first layer.

FIG. 9(B) is a view showing a pattern of the second layer.

P-type regions 121 and 123a are arranged on both sides of a high resistivity of channel region 122 and p-type regions 126 and 123b are arranged on both sides of another high resistivity of channel region 127. A p-type region 128 is arranged below these regions.

The first layer shown in FIG. 9(A) and the second layer shown in FIG. 9(B) are laminated such as shown in FIG. 9(C). Then, p-type regions 121 and 126 of the second layer are arranged on the channel regions 112 and 114 of the first layer to serve as a gate. Also, a p-type region 128 of the second layer is arranged on the channel regions 116 and 118 to serve as a gate.

N-type regions 113 and 115 of the first layer are arranged below the channel regions 122 and 127 of the second layer to serve as a gate.

As such, the lamination structure shown in FIG. 9(C) forms a configuration of six transistors. In the figure, N1 and N2 denote, connection nodes that connect the first layer and the second layer therewith.

In the configuration of FIG. 8(C), a voltage $V_{cc}$ is applied to the p-type region 123 in the center and a voltage $V_{ss}$ is applied to n-type regions 111a and 111b on both ends.

In the configuration of FIG. 9(C), a voltage $V_{ss}$ is applied to an n-type region 111 in the center and a voltage $V_{cc}$ is applied to p-type regions 123a and 123b on both ends. The configuration of either FIG. 8 or FIG. 9 can be selected using any wiring pattern.

In the above description, the case in which the layer of p-channel current path and n-channel current path are superposed is explained, but the present invention is not limited to this case.

Figure 10A:
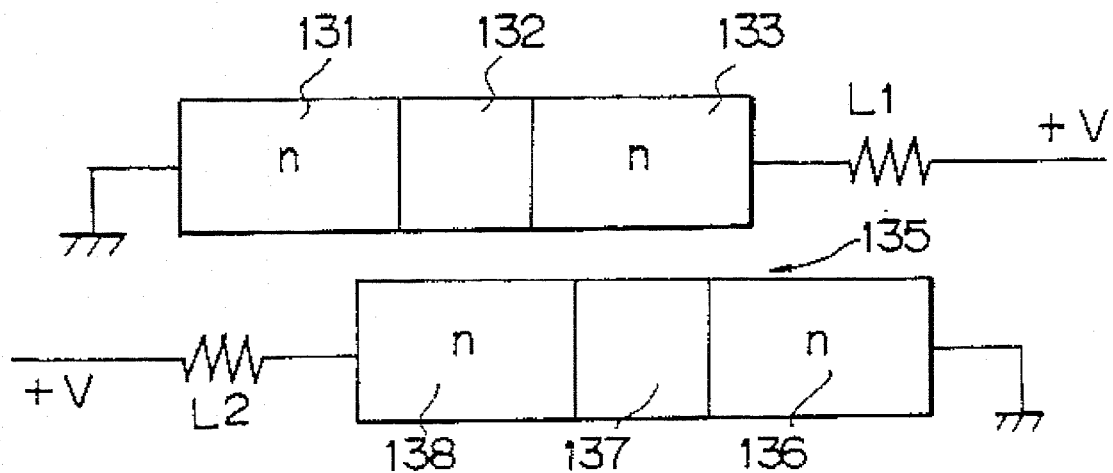
FIGS. 10(A) and 10(B) are views showing the configuration of a transistor pair or flip-flop according to another embodiment of the present invention.
Figure 10B:
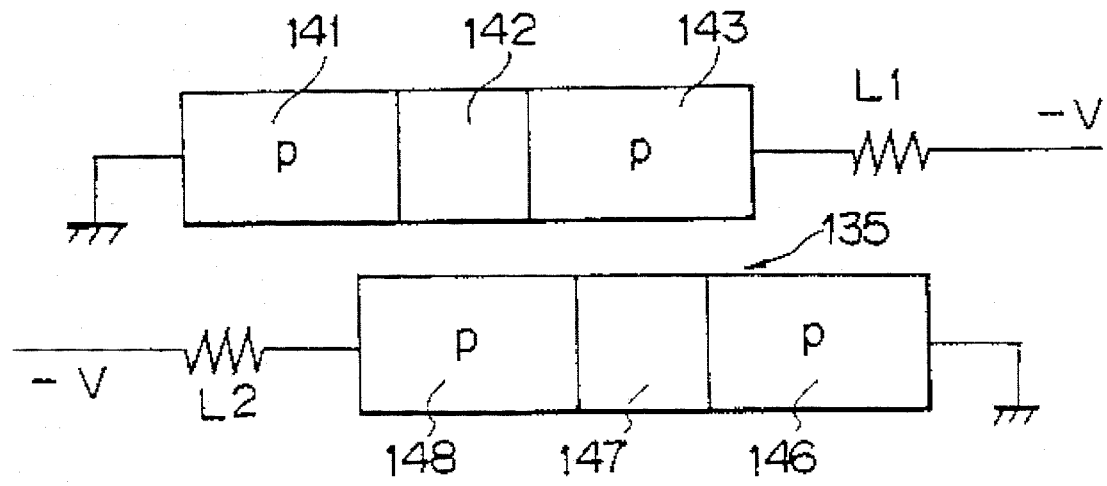

FIGS. 10(A) and 10(B) are views showing the configuration of a transistor pair or a flip-flop circuit according to another embodiment of the present invention.

FIG. 10(A) is a view showing the configuration of n-channel transistor pair.

In FIG. 10(A), two n-type regions 131 and 133 are arranged at one potential level by sandwiching a high resistivity of channel region 132 and two n-type regions 136 and 138 are arranged at another potential level close to this potential level by sandwiching a high resistivity of channel region 137. The channel region 137 is arranged adjacent to the n-type region 133 and the channel region 132 is arranged adjacent to the n-type region 138.

When a transistor pair is produced, an n-type region 133 of the upper side current path is connected to a positive potential via a load L1 and an n-type region 138 of the lower side current path is connected to a positive potential via a load L2. Another n-type regions 131 and 136 are connected to, for example, the ground potential.

When such connection is made, an n-channel is induced in the channel region 137 by a positive voltage of the n-type region 133, the voltage of n-type region 138 reduces and the channel region 132 is turned off by the voltage at the earth potential level.

Thus, a transistor including the channel region 137 is turned on and a transistor including the channel region 132 is turned off. There exists a stable state such that the channel region 137 is turned off and the channel region 132 is turned on, thereby a flip-flop is constituted.

FIG. 10(B) is a view showing the configuration of a p-channel transistor pair.

Similarly to FIG. 10(A), two p-type regions 141 and 143 are arranged at one potential level by sandwiching a high resistivity of channel region 142 and two p-type regions 146 and 148 are arranged at another potential level by sandwiching a high resistivity of channel region 147. A channel region 142 is arranged adjacent to a p-type region 148 and a channel region 147 is arranged adjacent to a p-type region 143. As is the same with FIG. 10(A), one side of the current terminal of the first current path and the second current path is grounded and the other side of current terminal is connected to a negative power source-V via loads L1 and L2. A p-channel is induced in the channel region 147 by a negative voltage applied to the p-type region 143. If the p-type region 148 is a negative voltage, the channel 142 is turned on to constitute a flip-flop circuit ** in the case of the n-type.

In the above, a transistor is described in a state where a voltage is not applied thereto, and is in a state of "turn OFF" and when a voltage is applied to a gate, a channel is induced to turn on. Nevertheless, the present invention is not limited to such type of transistor.

Figure 11A:
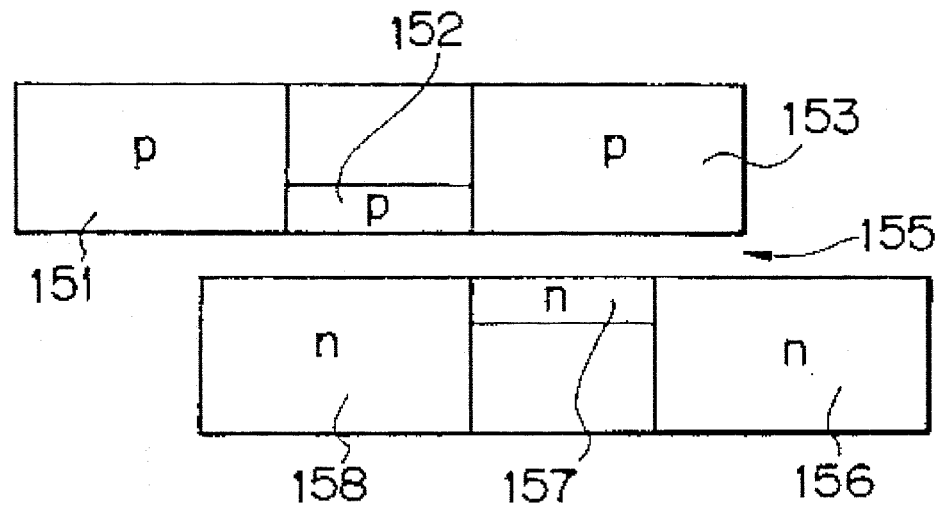
FIGS. 11(A) and 11(B) are views showing a transistor pair according to still another embodiment of the present invention.
Figure 11B:
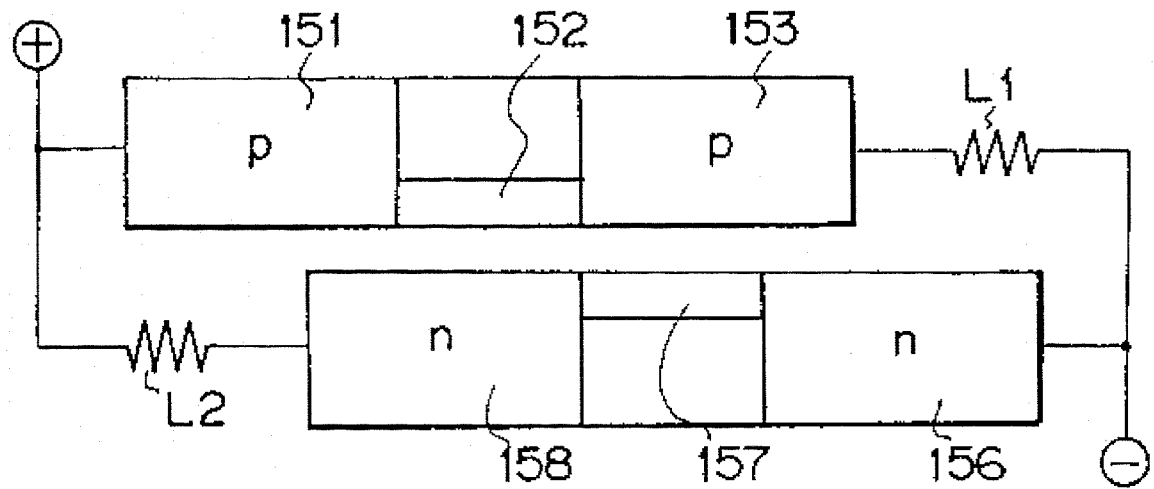

FIGS. 11(A) and (B) are views showing a transistor pair according to still another embodiment of the present invention. FIG. 11(A) shows a configuration and FIG. 11(B) an operation thereof.

In the configuration of FIG. 11(A), p-type regions 151 and 153 are connected therewith via a p-channel 152. The current path is arranged on another current path via an insulation film 155. In another current path, n-type regions 156 and 158 are connected therewith via an n-channel 157. A p-channel 152 is arranged on an n-type region 158 and an n-channel 157 is arranged below a p-type region 153.

Such configuration is connected to the power sources. That is, a p-type region 153 is connected to a negative voltage via a load L1 and another p-type region 151 is connected to a positive voltage. An n-type region 156 is directly connected to a negative voltage and another n-type region 158 is connected to a positive voltage via a load L2.

The potential at the p-type region 153 is higher than that at the n-type region 158, thus operating to deplete the n-channel 157.

Thus, in the configuration shown in the figure, both current paths are turned ON. If the transistor pair as shown in FIGS. 10 and 11 is utilized, it is apparent that a multifarious circuit can be designed by those skilled in the art.

According to the present invention, two current terminal regions can be easily designed and constitute a transistor pair by providing a pair of configurations sandwiching the channel region.

I claim:

1. A semiconductor device having a plurality of transistor pairs, each of said transistor pairs comprising:

a p-channel current path having a pair of p-type current terminal regions sandwiching a high resistivity first channel region; and an n-channel current path having a pair of n-type current terminal regions sandwiching a high resistivity second channel region, said first channel region and said second channel region each having an electric field which is exerted on the other by their intrinsic charges, said first and second channel regions being adjacently arranged so as to serve as a gate.

2. The device according to claim 1, wherein at least one of said p-channel and n-channel current paths of said transistor pair is formed by a polycrystalline semiconductor thin film.

3. The device according to claim 1, wherein at least one of said p-channel and n-channel paths of said transistor pair is formed in a single crystal semiconductor substrate and the other of said p-channel and n-channel current paths is formed on the at least one of said p-channel and n-channel current paths via an insulator film.

4. The device according to claim 1, wherein transistor pair is formed by two layers of polycrystalline semiconductor thin film formed on a substrate.

5. The device according to claim 1, wherein said transistor pair is formed by two layers of polycrystalline semiconductor thin film formed on a silicon-on-insulator (SOI) substrate.

6. The device according to claim 1, wherein one of said p-channel and n-channel current paths serves as a gate of the other of said p-channel and n-channel current paths.

7. The device according to claim 1, wherein said semiconductor device includes two of said transistor pairs interconnected to form a flip-flop.

8. A semiconductor device, comprising:

a first semiconductor structure including first and second current terminal regions of a first polarity type sandwiching a first channel region; and a second semiconductor structure including third and fourth current terminal regions of a second polarity type, opposite to the first polarity type, sandwiching a second channel region, said first and second semiconductor structures being positioned such that one of said third current terminal region, said fourth current terminal region and said second channel region induces a charge of opposite polarity in said first channel region, and said first and second semiconductor structures are positioned such that one of said first current terminal region, said second current terminal region and said first channel region induces a charge of opposite polarity in said second channel region.

9. A semiconductor device comprising:

a first current formed at a first potential level, and having a pair of current terminal regions sandwiching a first channel region;

a second current path formed at said first potential level, and having a pair of current terminal regions sandwiching a second channel region;

a third current path formed at a second potential level close to said first level, and having a pair of current terminal regions sandwiching a third channel region; and a fourth current path formed at said second potential level, and having a pair of current terminal regions sandwiching a fourth channel region, both of said first channel region and said third channel region and both of said second channel region and said fourth channel region exerting an electric field on each other by their intrinsic charges and adjacently arranged to serve as a gate.

10. The device according to claim 9, wherein one of said first, second, third and fourth channel regions serves as a gate and the other three of said first, second, third and fourth channel regions are laminated so as to be superposed on each other.

11. A semiconductor device comprising:

a first current path arranged at a first potential level, and having a first channel region formed by a high resistivity semiconductor and a first pair of low resistivity current terminal regions arranged on both sides of said first channel region;

a second current path arranged at a second potential level adjacent to said first potential level, and having a second channel region formed by a high resistivity semiconductor and a second pair of low resistivity current terminal regions arranged on both sides of said second channel region; and first separation means for separating said first current path and said second current path electrically, said first channel region and one of said second pair of current terminal regions being adjacently arranged and said second channel region and one of said first pair of current terminal regions being adjacently arranged, said first current path and said second current path forming a transistor pair that interacts with each other via an electric field.

12. A semiconductor device according to claim 11, further comprising:

a third current path arranged at said first potential level, and having a third channel region formed by a high resistivity semiconductor and a third pair of low resistivity current terminal regions arranged on both sides of said third channel region;

a fourth current path arranged at said second potential level, and having a fourth channel region formed by a high resistivity semiconductor and a fourth pair of low resistivity current terminal regions arranged on both sides of said fourth channel region; and second separation means for separating said third current path and said fourth current path electrically, said third channel region and one of said fourth pair of current terminal regions being adjacently arranged, and said third current path and said fourth current path forming a transistor pair that interacts with each other via an electric field.

13. A semiconductor device according to claim 12, wherein said device further comprises:

first connecting means for connecting said first current path and said fourth current path therewith;

second connecting means for connecting said third current path and said second current path therewith, wherein said first, second, third and fourth current paths constitute a flip-flop circuit.

14. A semiconductor device according to claim 13, wherein one of said first pair of current terminal regions and one of said third pair of current terminal regions are formed by a first common region.

15. A semiconductor device according to claim 14, wherein said first potential level is formed by a single crystal semiconductor substrate and said second potential level is formed by a polycrystalline semiconductor film.

16. A semiconductor device according to claim 14, wherein said first and second potential levels are formed by a polycrystalline semiconductor film.

17. A semiconductor device according to claim 13, wherein one of said second pair of current terminal regions and one of said fourth pair of current terminal regions are formed by a second common region.

18. A semiconductor device according to claim 17, wherein said first potential level is formed by a single crystal semiconductor substrate and said second potential level is formed by a polycrystalline semiconductor film.

19. A semiconductor device according to claim 17, wherein said first and second potential levels are formed by a polycrystalline semiconductor film.

20. A semiconductor device according to claim 13, wherein said first potential level is formed by a single crystal semiconductor substrate and said second potential level is formed by a polycrystalline semiconductor film.

21. A semiconductor device according to claim 13, wherein said first and second potential levels are formed by a polycrystalline semiconductor film.

22. A semiconductor device according to claim 12, wherein said first potential level is formed by a single crystal semiconductor substrate and said second potential level is formed by a polycrystalline semiconductor film.

23. A semiconductor device according to claim 12, wherein said first and second potential levels are formed by a polycrystalline semiconductor film.

24. A semiconductor device according to claim 11, wherein said first potential level is formed by a single crystal semiconductor substrate and said second potential level is formed by a polycrystalline semiconductor film.

25. A semiconductor device according to claim 11, wherein said first and second potential levels are formed by a polycrystalline semiconductor film.

26. A semiconductor device having a plurality of transistor pairs, each of said transistor pairs comprising:

a p-channel current path having a pair of p-type terminal regions sandwiching a high resistivity first channel region;

an n-channel current path having a pair of n-type current terminal regions sandwiching a high resistivity second channel region, said first channel region and said second channel region each having an electric field which is exerted on the other by their intrinsic charges; and source/drain regions respectively superposed with a respective one of said first and second channel regions, one side of each of said source/drain regions serving as a gate for the other side.

* * * * *

UNITED STATES PATENT AND TRADEMARK OFFICE
CERTIFICATE OF CORRECTION

PATENT NO. : 5,541,431
DATED : July 30, 1996
INVENTOR(S) : Kawashima

It is certified that error appears in the above-indentified patent and that said Letters Patent is hereby corrected as shown below:

In the "[57] Abstract", line 4, after "region," insert --and--.

Column 1, line 44, delete "disck" and insert --disclosed--.

Column 3, line 51, delete "and" (first occurrence) and insert --an--.

Column 4, line 41, delete ";" and insert --,--.

Column 5, line 6, delete "(D)" and insert --(B)--.

Column 6, line 67, delete "a" and insert --an--.

Column 8, line 48, delete "SRAm" and insert --SRAM--.

Column 10, line 12, delete "an" and insert --on--.

Column 10, line 20, after 2nd occurrance "step," insert --ion-implantation--.

Column 11, line 44, delete "sandwiche" and insert --sandwich--.

Column 11, line 64, delete "side" and insert --sides--.

Column 12, line 51, after "substrate" (second occurrence) insert --of--.

UNITED STATES PATENT AND TRADEMARK OFFICE
CERTIFICATE OF CORRECTION

PATENT NO. : 5,541,431
DATED : July 30, 1996
INVENTOR(S) : Kawashima

It is certified that error appears in the above-indentified patent and that said Letters Patent is hereby corrected as shown below:

```
Column 14, line 41, delete "**" and insert --as--.
Column 15, line 33, after "wherein" insert --said--.
Column 15, line 65, after "current" insert --path--.
```

Signed and Sealed this

Twenty-ninth Day of April, 1997

Attest:

Attesting Officer

BRUCE LEHMAN

Commissioner of Patents and Trademarks